(12) United States Patent
Ellenbeck et al.

(10) Patent No.: US 10,833,907 B2
(45) Date of Patent: Nov. 10, 2020

(54) LOW RATE INTERFACE FOR NARROW BAND WIRELESS TRANSMISSIONS

(71) Applicant: Intel Corporation, Santa Clara, CA (US)

(72) Inventors: Jan Ellenbeck, Munich (DE); Thorsten Clevorn, Munich (DE)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 15/283,035

(22) Filed: Sep. 30, 2016

(65) Prior Publication Data

US 2018/0097675 A1   Apr. 5, 2018

(51) Int. Cl.
| | |
|---|---|
| *H04L 27/26* | (2006.01) |
| *H04L 27/36* | (2006.01) |
| *H03C 5/00* | (2006.01) |
| *H04W 52/02* | (2009.01) |
| *H04L 12/18* | (2006.01) |

(52) U.S. Cl.
CPC ......... *H04L 27/2626* (2013.01); *H03C 5/00* (2013.01); *H04L 12/189* (2013.01); *H04L 27/2634* (2013.01); *H04L 27/36* (2013.01); *H04L 27/361* (2013.01); *H04W 52/0245* (2013.01); *Y02D 30/70* (2020.08)

(58) Field of Classification Search
CPC ............. H04L 27/2626; H04L 27/2602; H04L 5/0048; H04L 5/0023; H04L 1/0057; H04L 1/0041; H04L 1/0061; H04L 1/0042; H04L 1/0075; H04L 1/0625; H04L 12/189

USPC .......................................... 375/220; 370/474
See application file for complete search history.

(56) References Cited

U.S. PATENT DOCUMENTS

| | | | | |
|---|---|---|---|---|
| 2005/0198257 | A1* | 9/2005 | Gupta | .................. G06F 1/3215 709/224 |
| 2006/0038710 | A1* | 2/2006 | Staszewski | ............... H03F 3/24 341/143 |
| 2007/0009022 | A1 | 1/2007 | Chen | |
| 2007/0201535 | A1* | 8/2007 | Ahmed | ............... H04B 1/7136 375/135 |
| 2008/0080597 | A1* | 4/2008 | Rofougaran | ............. H04B 1/40 375/219 |

(Continued)

FOREIGN PATENT DOCUMENTS

WO   2018063679   4/2018

OTHER PUBLICATIONS

International Search Report and Written Opinion dated Dec. 13, 2017, on application No. PCT/US2017/049189.

(Continued)

*Primary Examiner* — David C Payne
*Assistant Examiner* — Sarah Hassan
(74) *Attorney, Agent, or Firm* — Schwegman Lundberg & Woessner, P.A.

(57) ABSTRACT

A mobile communication device may include a storage element and a baseband processing component operatively coupled to the storage element. The baseband processing component may generate representations of one or more symbols, provide the representations of the one or more symbols through an interface to a buffer element to process, and reduce communications through the interface to the buffer element during at least a portion of the processing of the representations of the one or more symbols.

16 Claims, 7 Drawing Sheets

(56) References Cited

U.S. PATENT DOCUMENTS

| | | |
|---|---|---|
| 2008/0146175 A1* | 6/2008 | Rakshani ............. H04B 1/0014 |
| | | 455/129 |
| 2009/0258612 A1 | 10/2009 | Zhuang et al. |
| 2010/0118206 A1* | 5/2010 | Gao ................... H03M 13/1102 |
| | | 348/723 |
| 2010/0135368 A1* | 6/2010 | Mehta .................... H04L 27/38 |
| | | 375/219 |
| 2012/0250538 A1 | 10/2012 | Su et al. |
| 2013/0195145 A1 | 8/2013 | Soliman et al. |
| 2014/0254444 A1 | 9/2014 | Kim et al. |
| 2015/0346807 A1* | 12/2015 | Homchaudhuri ..... G06F 1/3293 |
| | | 713/323 |
| 2016/0112885 A1* | 4/2016 | Ang ................... H04W 52/267 |
| | | 370/328 |

OTHER PUBLICATIONS

"International Application Serial No. PCT US2017 049189, International Preliminary Report on Patentabillity dated Apr. 11, 2019", 14 pgs.

"International Application Serial No. PCT US2017 049189, International Search Report dated Dec. 13, 2017", 3 pgs.

"International Application Serial No. PCT US2017 049189, Written Opinion dated Dec, 13, 2017", 12 pgs.

* cited by examiner

LOW RATE INTERFACE FOR NARROW BAND WIRELESS TRANSMISSIONS

BACKGROUND

The disclosure relates to the field of mobile communications, including narrowband wireless transmissions.

BRIEF DESCRIPTION OF THE DRAWINGS

Various implementations of the present disclosure will be understood more fully from the detailed description given below and from the accompanying drawings of various exemplary implementations of the disclosure.

DETAILED DESCRIPTION

Figure 1:
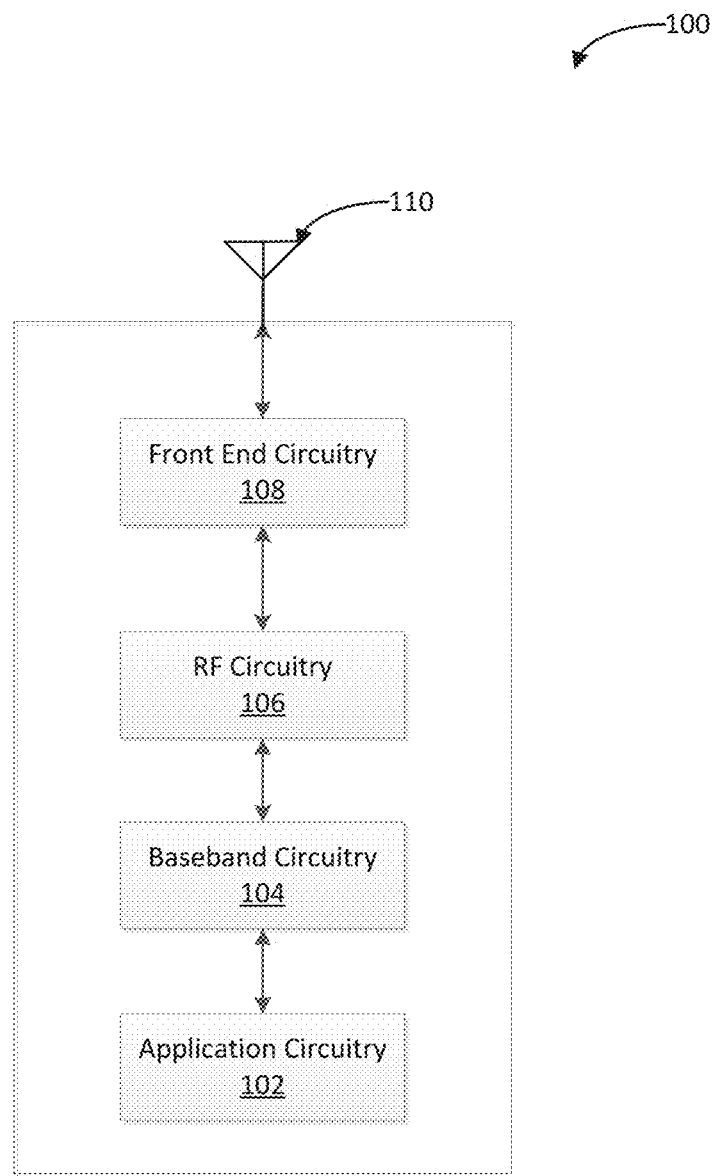
FIG. 1 illustrates a block diagram of a user equipment (UE) that includes application circuitry, baseband circuitry, radio frequency (RF) circuitry, Front End Circuitry, and one or more antennas according to an exemplary implementation.

In a traditional wireless communication standards, such as Long Term Evolution (LTE) standard, one of the critical areas for improvement and innovation is to minimize power consumption in mobile communications. With an advent of narrowband LTE transmissions, which is a new LTE standard variant, there is additional motivation to provide mobile communications via a narrow bandwidth using very low power consumption. For example, various devices providing narrowband LTE transmission may have low power requirements based on energy constraints of batteries powering the devices and expected battery life.

In a traditional approach, baseband circuitry of a mobile device may provide constant flow of Cartesian in-phase and quadrature (IQ) samples at a high data rate to a radio frequency (RF) circuitry for processing. As a consequence, the baseband circuitry may not only consume a large amount of power for generation and transmission of the IQ samples, but also is powered on during the transmission of signals from the RF circuitry to maintain the flow of IQ samples to the radio frequency circuitry. The examples disclosed herein may reduce the power consumed during narrowband transmissions by operating the baseband circuitry in a reduced power mode during part of a transmission period or reducing the signaling from the baseband circuitry to the RF circuitry. Accordingly, the baseband circuitry may provide representations of symbols that are to be transmitted using reduced signaling. For example, the symbols may be provided as a polar representation or as a limited set of IQ samples. The representations may then be stored in a buffer and used to generate sine waves for transmissions.

In some exemplary implementations, the reduced power operations may be used for single-tone operation modes of systems such as the 3rd Generation Partnership Project (3GPP) narrowband internet of things (NB-IoT) standard, 5G IoT standard, or other standards using a single-tone or single frequency wireless signal. In one exemplary implementation, the baseband circuitry may generate a polar representation of symbols that convey angular frequencies (sub-carriers), phase offsets, and amplitudes. The generated polar representations may then be provided to a memory buffer, either at radio frequency circuitry or associated with the baseband processors. The memory buffer may then provide the representations of the symbols to the radio frequency for processing. In another exemplary implementation, the baseband circuitry may generate a limited set of IQ samples to represent each symbol. For example, the limited set of IQ samples may be for a representative or beginning portion of the symbol. The IQ sample representations may then be provided to a memory buffer. The memory buffer may then provide the representations of the symbols to the radio frequency circuitry for processing and generation of a sine-wave based on the IQ samples.

Here, the baseband-radio frequency interface data rates for narrowband or single-tone operation are reduced compared to a traditional IQ sample interface without degrading the transmitted signal quality. For example, either polar-based signaling or a limited set of IQ samples may provide the same information as a high-bit rate IQ samples stream using less data. In addition, due to the fact that the amount of data being generated via polar signaling is substantially smaller as compared to IQ sample generation, the processing by a radio frequency circuitry may also be more power efficient. Furthermore, during the time the generated signals comprising polar signals and/or IQ samples are buffered and retrieved for processing by a radio frequency circuitry, a baseband circuitry can operate in a reduced power mode, a power-saving mode, or a sleep mode. In some implementations, the baseband circuitry may not operate in a reduced power mode, but the communications across a baseband to RF circuitry interface may be reduced as the transmission may be completed by the RF circuitry. The baseband circuitry may then perform other operations or remain idle. In some implementations, the baseband circuitry may not remain idle for an entire transmission period. For example, the baseband circuitry may generate representations of symbols in batches to provide to a buffer. Thus, the baseband circuitry may generate a portion of the symbols for a transmission, reduce power or perform other tasks for a period of time, and then generate a next portion of symbols for the transmission. As an example, a mobile device may generate representations of symbols that make up a quarter of a transmission (e.g., 250 ms in an example of a is transmission), operate with reduced power or with parts powered down while transmitting, and then generate representations of symbols for the next portion of the transmission to transmit after the first portion is transmitted. Accordingly, components may operate at reduced power, or without transmitting representations of symbols, during a plurality of non-continuous intervals of time of a transmission period.

The use of a narrow bandwidth may improve power consumption during uplink or downlink transmissions of a mobile device. In uplink transmissions, a mobile device may use single-tone transmissions with about 3.75 kHz or about 15 kHz subcarriers as an alternative to or in addition to about 3-12 tone about 15 kHz subcarrier uplink multi-tone transmission. With the benefits of the narrow bandwidths, transmission durations may be prolonged in time and further increased because up to 128-fold repetitions can be employed in order to increase the coverage. The transmission of a transport block, which in some exemplary implementations may include 1000 payload bits or fewer, can thus take dozens of milliseconds up to 40 seconds. However, the baseband-side processing may include simple calculations due to the small information content size and simplicity of the transmitted symbols. Furthermore, in some exemplary implementations, some narrowband transmission systems may be implemented as a half-duplex system, wherein the receiver does not receive transmissions during an ongoing uplink transmission.

In a traditional baseband-RF interface, the baseband circuitry may continuously stream IQ samples to the RF circuitry. This may generate high data rates at an interface to the RF circuitry. For example, the baseband circuitry may provide IQ samples at rates of about 1.92 M samples/s (e.g., the minimum rate for LTE and the smallest rate for which the cyclic prefixes for 15 kHz consist of an integer amount of samples). In one exemplary implementation, a transmission of 1000 payload bits would require up to about $10^{12}$ bits of IQ samples on the baseband-RF interface. However, a polar signal-based baseband-RF interface may be the advantageous approach in single tone transmissions to reduce the processing on baseband circuitry and transmissions over a baseband to RF interface. Instead of generating high resolution IQ samples in baseband, according to one exemplary implementation, a polar representation may be provided including the single tone "angular frequency" (i.e., the used subcarrier k=. . . 47 or k=0 . . . 11 for 3.75 and 15 kHz, respectively) used for the transmission, the required power (amplitude) r for the transmission, and for each transmitted modulation symbol the effective phase offset $\varphi$. Accordingly, the number and rate of bits provided in a polar representation of a transmission may be much lower for each symbol.

In addition to powering down during uplink transmissions, baseband circuitry may also increase to operational power levels to receive intermittent transmissions from a base station. For example, baseband circuitry may increase power to receive transmissions during time periods designated by a base station. In some exemplary implementations, the baseband circuitry may increase power every 256 ms for approximately 40 ms. These increases in operation gaps may allow the baseband circuitry or another component of a mobile device to estimate and correct any accumulated frequency offsets, for instance. If the system is able to maintain the required frequency accuracies without reception measurements, the baseband circuitry may generate and transmit uplink data without breaking to compensate for frequency shifts.

The uplink data and power savings for particular uplink transmissions may differ depending on the type of uplink data. For physical uplink shared channel (NPUSCH) transmissions, to signal an employed subcarrier k (angular frequency) and the transmission power/amplitude (r) once per transmission (e.g., with negligible data rate) to indicate the phase offsets $\varphi$ between each symbol (phase-shift keying). Accordingly, a transceiver that internally uses a polar architecture may generate the rotating angular values that may be used by a polar transmitter. In addition, a transmitter with an IQ-based architecture may generate the required signals. The possible phase offsets depend on several factors. First, due to the cyclic prefix, a certain phase offset results depending on the occupied subcarrier/angular frequency. Second, the BPSK or QPSK modulation symbols lead to a corresponding rotation/phase offset. Third, the standard further applies a variable phase offset to each symbol that may be configured to track the phases at the end of the previous symbol to allow implementing a pi/2-BPSK and pi/4-QPSK modulation. The particular timing may further depend on the type of signal to transmit. For example, there may be difference depending on whether the transmission is for an NPUSCH transmission, an NPUSCH control signal, a physical random access channel (NPRACH) transmission, or an NPRACH control signal.

For an NPUSCH format 1 transmission (i.e., the uplink data transmission) the above contributions yield 64 unique phase offsets for 3.75 kHz single-tone and 256 unique phase offsets for 15 kHz single-tone transmission. For NPUSCH format 2 (i.e., transmission of ACK/NACK for DL transmission in uplink), the demodulation reference symbols have rotations of 2/3 pi and 4/3 pi, which would likely not coincide with the 256 unique offsets. As a consequence, a different encoding would be necessary (or <1% EVM contribution with the format 1 phase offsets).

For the NPRACH preamble, which may use a frequency hopping scheme of 3.75 kHz subcarrier single-tone transmissions, the amount of phase offsets depends on the current subcarrier due to the cyclic prefixes and is thus very small. However, different subcarriers (angular frequencies) k=0 . . . 11 or k=0 . . . 47 (i.e., max. 6 bits) on each hopping step may be signaled. Overall, the signaling rate is very small because a new random access symbol group requiring a phase/frequency change is only happening every 1.4 ms or 1.6 ms depending on the preamble format. In addition to the phase offsets and angular frequencies, timing and amplitude information need to be signaled. Though the amplitude/power can vary, they are fixed over the duration of a transmission. The symbol timing (i.e. symbol durations, and in case of 3.75 kHz guard periods) depends on the use case and can thus be signaled in advance. Further, SRS puncturing can be required, which would need another separate signaling of time periods during which the RF needs to suppress the uplink signal to protect legacy LTE SRS transmission from other devices in an in-band use case.

The amount of time a transmission takes, and therefore the amount of time that baseband processing may operate in a reduced power mode, may be determined based on the length of a transmission (e.g., the number of symbols to be sent) as well as a number or repetitions for each symbol. The number of repetitions may depend on the signal quality. For example, the number of repetitions may be set by a base station for a mobile device or may be set by the user device based on a received signal strength indicator.

For a 1000 bit payload, the length of the transmission may therefore be set based on the number of repetitions. For example, in a single-tone physical uplink shared channel (NPUSCH) transmission with 3.75 kHz subcarrier, the transmission period may range from about 32 milliseconds (NRU=1, NRep=1) in good transmission quality to about 40.960 seconds (NRU=10, NRep=128), in poor transmission quality. Transmissions with up to two repetitions (i.e., durations of <=64 . . . 640 milliseconds depending on NRU) may use open-loop power control. In another example, in a single-tone NPUSCH transmissions with 15 kHz subcarrier, the transmission period may range from about 8 milliseconds (NRU=1, NRep=1) in good transmission quality to about 10.240 seconds (NRU=10, NRep=128) in poor transmission quality. Transmissions with up to two repetitions (i.e., durations of <=16 . . . 160 ms depending on NRU) may use open-loop power control. In another example, for ACK/NACK transmissions (NPUSCH Format 2, with 3.75 kHz subcarrier) the transmission period may range from about 8 milliseconds in good transmission quality to about 1.024 seconds (1 . . . 128 repetitions) in poor transmission quality. Transmissions with up to two repetitions (i.e., durations of <=16 ms) may use open-loop power control. In another example, for ACK/NACK transmission (NPUSCH Format 2 with 15 kHz subcarrier), transmission periods may range from about 2 milliseconds to about 256 milliseconds (1 . . . 128 repetitions). In another example, in a physical random access channel (NPRACH) preamble transmission (3.75 kHz hopping sequence), transmissions may range from 5.6/6.4 milliseconds in good transmission quality to about 716.8/819.2 milliseconds (128 repetitions) in poor transmission quality. The shortest NPRACH duration may occur with open-loop power control, and the longer durations may occur at maximum transmission power.

Accordingly, based on the duration of a transmission, the baseband circuitry, components of the baseband circuitry, or other components of a mobile device may operate in a reduced power mode for a predetermined amount of time. The power savings of the low data rate interface and buffering representations of symbols may be increased for longer transmissions as the power consumption is reduced for a longer period of time. In some exemplary implementations, baseband circuitry may determine whether to reduce power based on the length of a transmission. For example, the baseband circuitry may determine not to operate with reduced power if the transmission period is shorter than a threshold. The threshold may be based on additional operations that may be performed to move into or out of reduce power operating modes.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed disclosure. However, various aspects of the disclosed exemplary implementations may be practiced in other examples that depart from these specific details. In certain instances, descriptions of well-known devices, circuits, and methods are omitted so as not to obscure the description of the present disclosure with unnecessary detail.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some exemplary implementations, the circuitry may be implemented in, or functions associated with the circuitry may be implemented by, one or more software or firmware modules. In some exemplary implementations, circuitry may include logic, at least partially operable in hardware.

Exemplary implementations described herein may be implemented into a system using any suitably configured hardware and/or software. FIG. 1 illustrates, for one exemplary implementation, a block diagram of example components of a wireless device 100. In some exemplary implementations, the wireless device 100 may include application circuitry 102, baseband circuitry 104, radio frequency (RF) circuitry 106, front-end circuitry 108, and one or more antennas 110, coupled together at least as shown.

In the wireless device 100, the application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage element and may be configured to execute instructions stored in the memory/storage element to enable various applications and/or operating systems to run on the system. The storage element may be a buffer memory.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuity 104 may interface with the application circuitry 102 for generation and processing of the baseband signals and for controlling operations of the RF circuitry 106. For example, in some exemplary implementations, the baseband circuitry 104 may include a second generation (2G) baseband processor, a third generation (3G) baseband processor, a fourth generation (4G) baseband processor, and/or other baseband processor(s) for other existing generations, generations in development, or to be developed in the future (e.g., fifth generation (5G), 6G, or the like). The baseband circuitry 104 may handle various radio control functions that enable communication with one or more radio networks via the RF circuitry 106. The radio control functions may include, but are not limited to, signal modulation/demodulation, encoding/decoding, radio frequency shifting, etc.

In some exemplary implementations, modulation/demodulation circuitry of the baseband circuitry 104 may include Fast-Fourier Transform (FFT), preceding, and/or constellation mapping/demapping functionality. In some exemplary implementations, encoding/decoding circuitry of the baseband circuitry 104 may include convolution, tail-biting convolution, turbo, Viterbi, and/or Low Density Parity Check (LDPC) encoder/decoder functionality. Exemplary implementations of modulation/demodulation and encoder/decoder functionality are not limited to these examples and may include other suitable functionality in other exemplary implementations.

In some exemplary implementations, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) of the baseband circuitry 104 may be configured to run elements of the protocol stack for signaling of the PHY, MAC, RLC, PDCP, NAS, and/or RRC layers. In some exemplary implementations, the baseband circuitry may include one or more audio digital signal processor(s) (DSP). The audio DSP(s) may include elements for compression/decompression and echo cancellation and may include other suitable processing elements in other exemplary implementations. Components of the baseband circuitry may be suitably combined in a single chip, a single chipset, or disposed on a same circuit board in some exemplary implementations. In some exemplary implementations, some or all of the constituent components of the baseband circuitry 104 and the application circuitry 102 may be implemented together such as, for example, on a system on a chip (SoC).

In some exemplary implementations, the baseband circuitry 104 may provide for communication compatible with one or more radio technologies. For example, in some exemplary implementations, the baseband circuitry 104 may support communication with an evolved universal terrestrial radio access network (EUTRAN) and/or other wireless metropolitan area networks (WMAN), a wireless local area network (WLAN), a wireless personal area network (WPAN). Exemplary implementations in which the baseband circuitry 104 is configured to support radio communications of more than one wireless protocol may be referred to as multi-mode baseband circuitry.

In some exemplary implementations, the baseband circuitry 104 may include an interface to RF circuitry 106. In some exemplary implementations, the baseband circuitry 104 may generate IQ samples, polar signals, or both to provide a representation of symbols to RF circuitry 106 through the interface. The baseband circuitry 104 may provide the generated representations to a memory buffer that provides a representation to a sine wave generator of the RF circuitry 106. In some exemplary implementations, the memory buffer may be implemented in the baseband circuitry 104 and the baseband circuitry may generate IQ samples from the representations in the buffer to provide or the RF circuitry 106 while other processing components of the baseband circuitry 104 operate in a reduced power mode.

RF circuitry 106 may enable communication with wireless networks using modulated electromagnetic radiation through a non-solid medium. In various exemplary implementations, the RF circuitry 106 may include switches, filters, amplifiers, etc. to facilitate the communication with the wireless network. RF circuitry 106 may include a receive signal path which may include circuitry to down-convert RF signals received from the front end circuitry 108 and provide baseband signals to the baseband circuitry 104. RF circuitry 106 may also include a transmit signal path which may include circuitry to up-convert baseband signals provided by the baseband circuitry 104 and provide RF output signals to the front end circuitry 108 for transmission.

Front end circuitry 108 may include a receive signal path which may include circuitry configured to operate on RF signals received from one or more antennas 110, amplify the received signals and provide the amplified versions of the received signals to the RF circuitry 106 for further processing. Front end circuitry 108 may also include a transmit signal path which may include circuitry configured to amplify signals for transmission provided by the RF circuitry 106 for transmission by one or more of the one or more antennas 110.

In some exemplary implementations, the front end circuitry 108 may include a TX/RX switch to switch between transmit mode and receive mode operation. The front end circuitry 108 may include a receive signal path and a transmit signal path. The receive signal path of the front end circuitry 108 may include a low-noise amplifier (LNA) to amplify received RF signals and provide the amplified received RF signals as an output (e.g., to the RF circuitry 106). The transmit signal path of the front end circuitry 108 may include a power amplifier (PA) to amplify input RF signals (e.g., provided by RF circuitry 106), and one or more filters to generate RF signals for subsequent transmission (e.g., by one or more of the one or more antennas 110).

In some exemplary implementations, the wireless device 100 may include additional elements such as, for example, memory/storage, display, camera, sensor, and/or input/output (I/O) interface.

Figure 2:
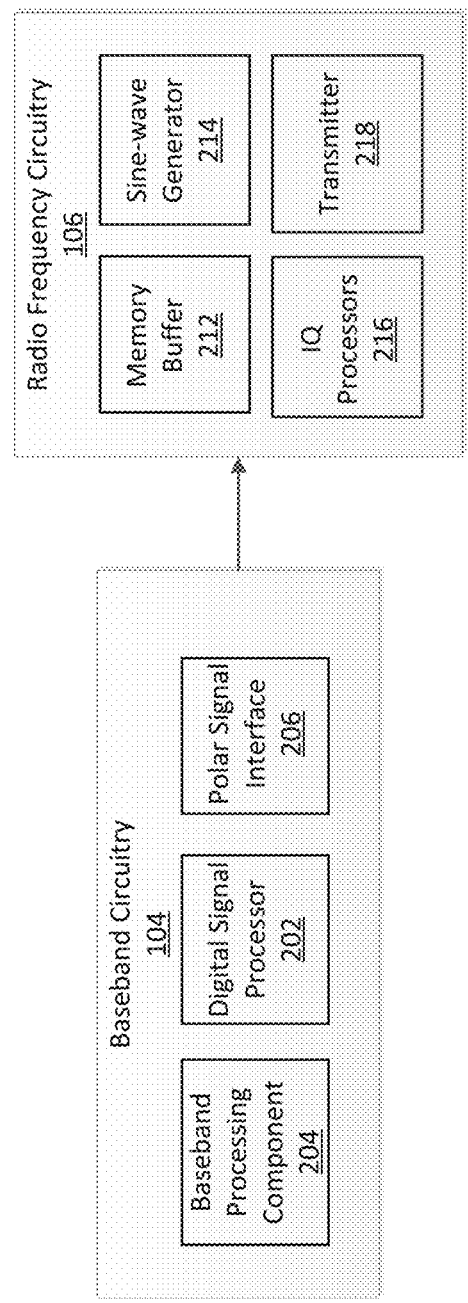
FIG. 2 is a block diagram illustrating components of an electronic device implementing aspects of the disclosure, according to an exemplary implementation.

FIG. 2 illustrates a block diagram of a portion of a mobile communication device comprising the baseband circuitry 104 and the RF circuitry 106 according to one exemplary implementation. In some exemplary implementations, the baseband circuitry 104 may comprise a baseband processing component 204 (e.g., a central processing unit (CPU)), a digital signal processor (DSP) 202, and a polar signal interface 206. In some exemplary implementations, the digital signal processor 202 may control operation of the baseband circuitry 104 without an additional baseband processing component 204. In some exemplary implementations, the RF circuitry may comprise a memory buffer/ storage element 212, a sine-wave generator 214, IQ processors 216, and transmitter 218.

In various exemplary implementations, the baseband processing component 204 may be configured to control the overall operation of the baseband circuitry 104. For example, the baseband processing component 204 may process signals received from application circuitry or provide signals to application circuitry. In some exemplary implementations, the baseband processing component 204 may also provide processing to work in conjunction with DSP 202. The baseband processing component 204 may be configured to control the processing, encoding, decoding, modulating, or demodulating of signals according to one exemplary implementation. In some exemplary implementations, the baseband processing component 204 may be configured to control the baseband signal generation and/or processing such as data encoding/decoding, data modulating/demodulating, data sampling, data error correcting, etc. The baseband processing component 204 may further be configured to perform power management operations for one or more components of the baseband circuitry 104 or other components of a mobile device.

In various exemplary implementations, the DSP 202 may be configured to process digital signals such as data encoding/decoding, data modulating/demodulating, data sampling, data error correcting, etc.

In one exemplary implementation, the baseband circuitry 104 may be configured to generate representations of one or more symbols and configured to provide the representations of the one or more symbols to the memory buffer 212 through a polar signal interface 206 for processing. The representations of the symbols may represent each symbol in a transmission to be performed by a mobile device. For example, each representation may indicate a single symbol in a packet of data to be transmitted by the mobile device over a narrowband transmission. In some exemplary implementations, the representations may include additional representations for symbols in header or address components of a packet. The representations of the one or more symbols may comprise polar signals indicating one or more sine waves to provide for the symbol. For example, a representation of a particular symbol may include an indication of a subcarrier, a phase offset, and an amplitude according to one exemplary implementation. In some exemplary implementations, the representations of the one or more symbols may comprise IQ samples of a first duration of the symbols, wherein the first duration is to be extended by a RF circuitry.

The polar signal interface 206 may be configured to provide the representations of one or more symbols to a memory buffer. For example, the DSP 202 or baseband processing component 204 may provide the representations through the polar signal interface 206 to pass the representations to memory buffer 212. As discussed further with reference to the Figures below, in some exemplary implementations, the memory buffer 212 may be provided on the baseband circuitry 104 rather than on the RF circuitry 106. Furthermore, in some exemplary implementations, the memory buffer 212 may be provided as a separate component from the baseband circuitry 104 or the RF circuitry 106.

In one exemplary implementation, the representations stored in memory buffer 212 may be accessed by the RF circuitry 106 and provided by the sine-wave generator 214 to generate a sine wave having the characteristics indicated by the representation. In some exemplary implementations using multi-tone signals, multiple sine-wave generators may be used to generate a sine-wave for additional components of a symbol. In some exemplary implementations, the sine-wave generator 214 may generate a single frequency sine wave. For example, a single tone frequency may be generated with 3.75 kHz subcarriers or 15 kHz subcarriers to conform to one or more wireless standards.

In some exemplary implementations wherein the representations of symbols are IQ samples of an initial portion of the symbol, an IQ Processor 210 or sine-wave generator 214 may process the IQ samples to extend the length of the sine-wave indicated by the IQ samples. For example, the IQ samples may be provided to the sine-wave generator 214 to generate a sine wave based on a first representation of a first of the one or more symbols.

In various exemplary implementations, one or more components of the baseband circuitry 104 may be configured to enter a power saving mode or a sleep mode during a period of time during which the representations of the one or more symbols in memory buffer 212 are used by the RF circuitry 106 to generate sine-waves. For example, the baseband circuitry 104 may be configured to enter a power saving mode or a sleep mode during a predetermined period of time.

The predetermined amount of time may be calculated based on the number of symbols to be transmitted and the number of times to repeat the transmission of each symbol. The number of symbols and number or repetitions may be used to determine a transmission period for the packet being transmitted by the mobile device. In some exemplary implementations, the baseband circuitry 104 may enter a power saving or sleep mode until receiving a notification from RF circuitry 106 or another component indicating that a transmission comprising the symbols of the representations has been completed.

In some exemplary implementations, baseband circuitry 104 may enter a power saving or sleep mode by reducing power or turning off one or more components of baseband circuitry 104. For example, the baseband processing component 204, the DSP 202, and the polar signal interface 206 may each be powered down, or a combination may be powered down. In some exemplary implementations, DSP 202 and polar signal interface 206 may operate in a reduce power mode, while the baseband processing component 204 operates in a normal mode to receive signals from application circuitry or other circuitry.

In one exemplary implementation, the RF circuitry 106 may be configured to comprise a power amplifier (not depicted in FIG. 2). In some exemplary implementations, the RF circuitry 106 may provide the generated sine-waves to a power amplifier or front end circuitry through transmitter 218 for transmission.

Figure 3:
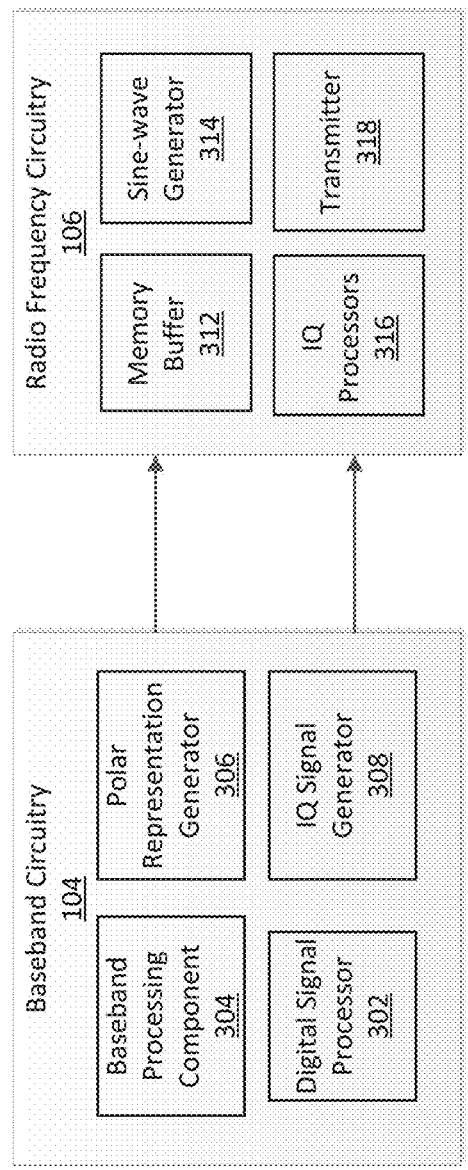
FIG. 3 is a block diagram illustrating components of an electronic device implementing aspects of the disclosure, according to an exemplary implementation.

FIG. 3 illustrates a block diagram of a portion of a mobile communication device comprising the baseband circuitry 104 and the RF circuitry 106 according to one exemplary implementation. The polar-based signaling approach described with reference to FIG. 1 is applicable to single-tone modes of systems. However, similar components may be implemented alongside multi-tone modes in some example systems as an optional feature. For example, the polar baseband to RF interface may be implemented in a mobile device that also provides an IQ-based interface.

In some exemplary implementations, the baseband circuitry 104 may comprise a baseband processing component 304 (e.g., a central processing unit (CPU)), a digital signal processor (DSP) 302, a polar representation generator 306 and an IQ signal generator 308. In some exemplary implementations, the RF circuitry 106 may comprise a memory buffer 312, a sine-wave generator 314, IQ processors 316, and transmitter 318. The transmitter 318 may include an IQ modulator or a polar modulator.

In some exemplary implementations, the IQ representation generator 308 may be configured to generate IQ samples to represent a symbol that is part of a transmission. A first interface may be configured to provide the generated IQ samples to store in the memory buffer 312 to be retrieved for processing by RF circuitry 106. In some exemplary implementations, the IQ signal generator 308 may also be used to provide IQ samples to the RF circuitry during transmission other than narrowband transmissions. For example, multi-tone transmissions may be provided to the RF circuitry to be processed by IQ processors 316.

In one exemplary implementation, the polar representation generator 306 may be configured to generate a polar representation of a symbol that is part of a transmission. A second interface may be to provide the generated polar signals to the memory buffer 312.

In various exemplary implementations, one or more components of the baseband circuitry 104 or RF circuitry 106 may be configured to enter a power saving mode or a sleep mode during a period of time during which the representations of the one or more symbols in memory buffer 312 are used by the RF circuitry 106 to generate sine-waves. For example, the baseband circuitry 104 may be configured to enter a power saving mode or a sleep mode during a predetermined period of time. The predetermined amount of time may be calculated based on the number of symbols to be transmitted and the number of times to repeat the transmission of each symbol. The number of symbols and number or repetitions may be used to determine a transmission period for the packet being transmitted by the mobile device. In some exemplary implementations, the baseband circuitry 104 may enter a power saving or sleep mode until receiving a notification from RF circuitry 106 or another component indicating that a transmission comprising the symbols of the representations has been completed.

In some exemplary implementations, baseband circuitry 104 may enter a power saving or sleep mode by reducing power or turning off one or more components of baseband circuitry 104. For example, the baseband processing component 304, the DSP 302, and the polar representation generator 306 and IQ signal generator 308 may each be powered down, or a combination may be powered down. In some exemplary implementations, DSP 302, polar signal interface 306, and IQ signal generator may operate in a reduce power mode, while the baseband processing component 304 operates in a normal mode to receive signals from application circuitry or other circuitry.

In some exemplary implementations, one or more components of RF circuitry 106 may also operate in a low power mode or sleep mode during a time when the RF circuitry 106 generates sine-waves from representations stored in memory buffer 312. For example, the IQ processors 316 may operate in a lower power mode, or may be powered off, while the sine-wave generator 314 and transmitter 318 generate and provide sine-waves for transmission by the mobile device.

Figure 4:
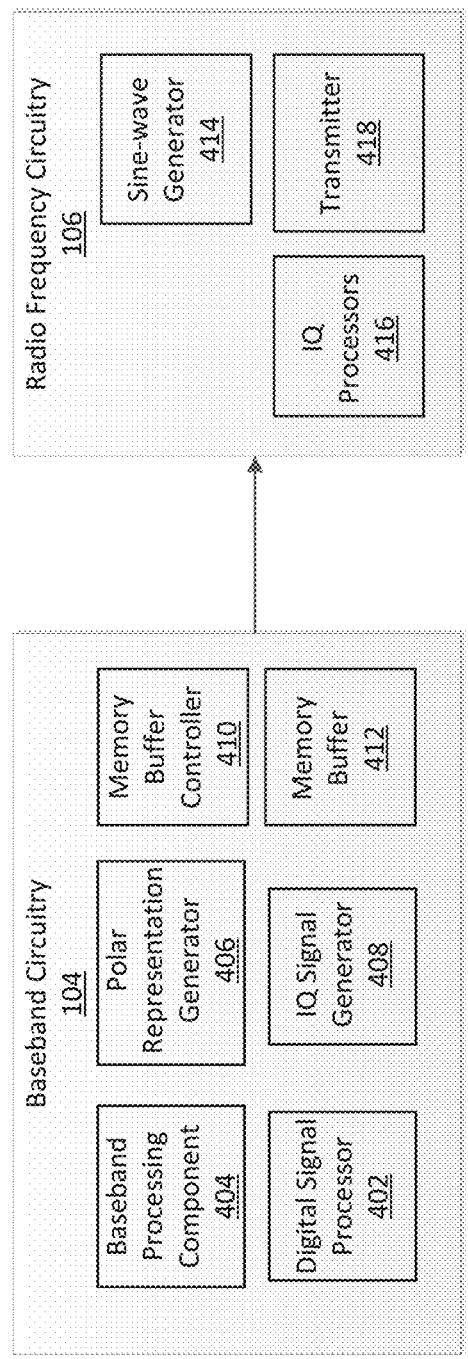
FIG. 4 is a block diagram illustrating components of an electronic device implementing aspects of the disclosure, according to an exemplary implementation.

FIG. 4 illustrates a block diagram of a portion of a mobile communication device comprising the baseband circuitry 104 and the RF circuitry 106 according to one exemplary implementation. In FIG. 4, a memory buffer 412 and associated memory buffer controller 410 that store representations of symbols of a transmission and generate IQ signals to RF circuitry 106. In some exemplary implementations, the baseband circuitry 104 may comprise a baseband processing component 404 (e.g., a central processing unit (CPU)), a digital signal processor (DSP) 402, a polar representation generator 406, an IQ signal generator 408, a memory buffer controller 410 and a memory buffer 412. In some exemplary implementations, the RF circuitry may comprise a sine-wave generator 414, IQ processors 416, and transmitter 418. The transmitter 318 may include an IQ modulator or a polar modulator.

In some exemplary implementations, the polar representation generator 406 may be configured to generate polar representations comprising an indication of a subcarrier, a phase offset, and an amplitude based on processed baseband signals received from the DSP 402. The polar representation generator 406 may then provide the representations to memory buffer 412. In some implementations, the baseband circuitry 104 may provide an initial set of IQ samples to the memory buffer 412 rather than a polar representation of symbols. The memory buffer controller 410 may be configured to control operation of memory buffer 412. For example, the memory buffer controller 410 may operate to control operation of memory buffer 412 during a time when one or more other components of baseband circuitry 104 are operating in a reduced power or sleep mode.

In one exemplary implementation, the IQ signal generator 408 may be configured to generate IQ samples. The memory buffer controller 410 may be configured to generate IQ samples to the RF circuitry 106. In some exemplary implementations, the IQ signal generator 408 may access representations of one or more symbols stored in memory buffer 412 to generate IQ samples to provide to RF circuitry 106. For example, the IQ signal generator 408 may access symbols from memory buffer 412 as directed by memory buffer controller 410 to generate IQ samples. Accordingly, the baseband circuitry 104 may generate and provide IQ samples to the RF circuitry 106 while operating baseband processing component 404, DSIP 402, or polar representations generator 406, or a combination of those components, in a low power or reduced power mode.

In one exemplary implementation, the configuration of an IQ signal generator 408 coupled with a memory buffer controller 410 and a memory buffer 412 in a baseband circuitry may be configured to be implemented to provide IQ signals to conventional RF circuitry 106. The RF circuitry may include an IQ processor 416, a Digital to Analog Convertor (DAC), a Synthesizer, a frequency upconvertor, an amplifier, transmitter 418, sine-wave generator 414, or the like. The transmitter 318 may include an IQ modulator or a polar modulator. In some implementations, RF circuitry 106 may include fewer or additional components, or may include different components.

In one exemplary implementation, the RF circuitry 106 or front end circuitry may be configured to comprise an amplifier (not depicted in FIG. 4). The baseband circuitry 104 may be configured to enter a power saving mode or a sleep mode at least during a period of time during which the sine-waves are provided to the power amplifier for transmission.

Figure 5:
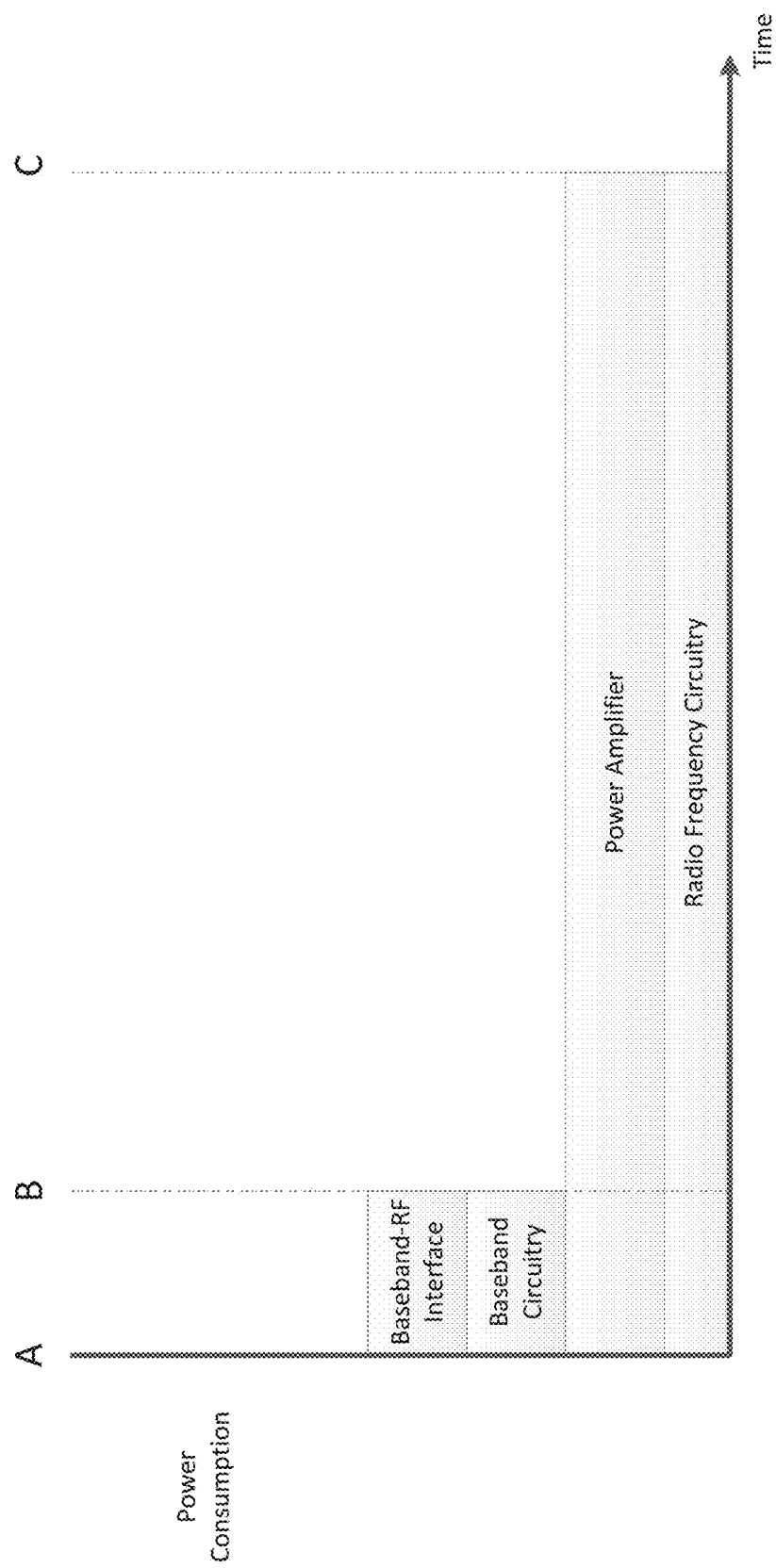
FIG. 5 is a timing diagram showing power consumption of components of an electronic device, according to an exemplary implementation.

FIG. 5 illustrates power consumption of a mobile communication device with respect to elapsed time. For example, the power consumption illustrated in FIG. 5 may be the power consumed by components as shown in one of FIGS. 1-4. The time in FIG. 5 may be represented on the horizontal access, while a rate of power consumption may be shown in the vertical access. In the timing diagram shown in FIG. 5, time A may indicate a time at which a baseband processor begins processing a transmission. At time B, the baseband circuitry may have completed generating representations of each symbol in the transmission. For example the baseband circuitry may have generated the representations and provided them to a memory buffer at time B. The baseband circuitry and a baseband to RF interface may reduce power at that time until the transmission is complete. At time C, the RF circuitry may have completed generating sine-waves based on the representations stored in a buffer. The power amplifier may further have completed providing amplified sine-waves to an antenna for transmission at time C.

In one exemplary implementation, a first interval of time, indicated by the time between time A and time B, may be the duration of time during which baseband circuity generates representations of one or more symbols. The first interval of time can be referred to as a symbol representation generation time. Baseband circuitry may consume power during a first time interval.

During the first interval of time, the generated representations of the one or more symbols may also be provided to a memory buffer. In some exemplary implementations, the generated representations may be provided from baseband circuitry to RF circuitry during a second time interval. A baseband to RF interface may consume power during the second time interval. In some exemplary implementations, the first time interval and the second time interval may be different. For example, the second time interval may start after or end after the first time interval. In some exemplary implementations, the first time interval and the second time interval may be the same.

In some exemplary implementations, a power amplifier may be configured to be implemented on the same RF circuitry chip or configured to be operatively coupled to the RF circuitry (e.g., on front end circuitry). The RF circuitry may transmit generated signals through the power amplifier. The power amplifier may consume power during a third time interval defined by the period between time A and time B in FIG. 5. During the third time interval, which may be defined as a transmission period, the RF circuitry may generate sine-waves based on the representations stored in the memory buffer, and may provide those signals through a power amplifier (or other front end circuitry) to an antenna for transmission.

The baseband circuitry or the baseband signal interface may be configured to operate in a power saving mode or a sleep mode during a fourth time interval during which the RF circuitry generates sine-waves for transmission, but the baseband circuitry has already provided representations of symbols for transmissions.

Figure 6:
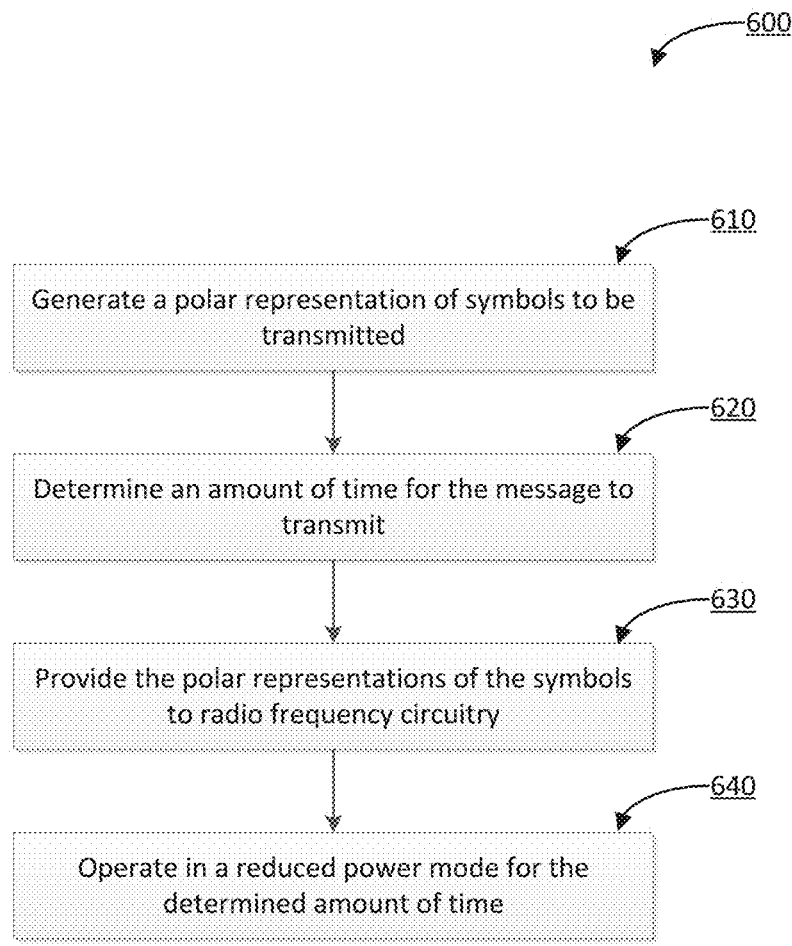
FIG. 6 illustrates a flowchart of an example method of operating a low rate interface, according to an exemplary implementation.

FIG. 6 illustrates a flowchart of an example method of operating a low rate interface, according to an exemplary implementation. Beginning in block 610, baseband circuitry may generate a polar representation of symbols to be transmitted. For example, the polar representations may include a phase offset, a subcarrier, and an amplitude for each symbol. In some exemplary implementations, the subcarrier and amplitude may be set once for all, or a subset, of the symbols in a transmission. Then additional symbols may be represented by a phase offset alone. In some exemplary implementations, other polar representations, or other types of representations may be used alternatively or in addition to the polar representations described. For example, a limited set of IQ samples may be used as representations for particular symbols.

In block 620, the baseband circuitry may determine an amount of time for the message to transmit. For example, a transmission time may be calculated by the baseband circuitry based on the number of symbols in a transmission multiplied by a number of repetitions per symbol. The number of repetitions may be set by base station signaling to the mobile device or based on a determination of signal quality at the mobile device.

In block 630, the baseband circuitry provides the polar representations of the symbols to RF circuitry. For example, the polar representations may be provided to RF circuitry over a baseband to RF circuitry interface that is configured to transport polar representations. The RF circuitry may receive the representations at a memory buffer. In some exemplary implementations, the baseband circuitry may provide the polar representations to a memory buffer associated with the baseband circuitry rather than to a memory buffer on the RF circuitry. In some exemplary implementations, the operations performed in block 630 may be performed concurrently to those performed in block 610. For example, the baseband circuitry may provide polar representations to a memory buffer as they are generated for particular symbols.

In block 640, the baseband circuitry may operate in a reduced power mode for the determined amount of time. For example, the baseband circuitry may operate in a reduced power mode by reducing power to processing elements, memory components, or other components of baseband circuitry during transmission by the RF circuitry. In some exemplary implementations, the baseband circuitry may enter a sleep mode or other reduced power state during the transmission period. In exemplary implementations where a memory buffer is provided associated with the baseband circuitry, the memory buffer and a memory buffer controller or IQ sample generator may operate to provide IQ samples to the RF circuitry while other components of the baseband circuitry operate with reduced power.

Figure 7:
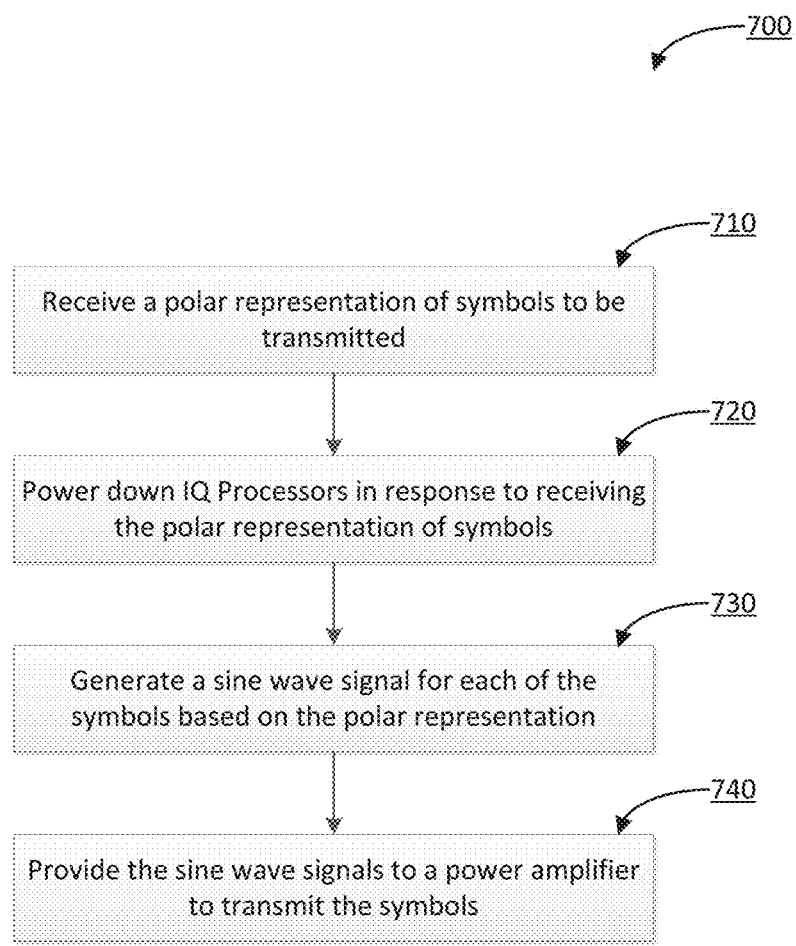
FIG. 7 illustrates a flowchart of an example method of operating a low rate interface, according to an exemplary implementation.

FIG. 7 illustrates a flowchart of an example method of operating a low rate interface, according to an exemplary implementation. Beginning in block 710, a memory buffer of RF circuitry receives a polar representation of symbols to be transmitted in a transmission. For example, the polar representations may be received from baseband circuitry over a polar interface.

In block 720, the RF circuitry may power down IQ processors in response to receiving the polar representations of symbols. For example, to generate sine-waves and transmit those sine waves, there may not be a requirement to use IQ processors. Accordingly, the power may be reduced to the IQ processors to reduce power consumption.

In block 730, a sine-wave generator of the RF circuitry may generate a sine-wave for each of the symbols in the transmission. The length of the sine-wave may be based on a carrier or sub-carrier for the transmission as well as on a number of repetitions for the symbol. In block 740, the RF circuitry may then provide the sine wave signals to a power amplifier to transmit the symbols. For example, the power amplifier may be part of the RF circuitry or part of front end circuitry. The amplified sine waves may then be transmit from the mobile device through an antenna.

The following examples pertain to further exemplary implementations of the disclosure.

Example 1 is an apparatus of a mobile communication device comprising: a buffer element; and a baseband processing component operatively coupled to the buffer element, the baseband processing component to: generate representations of one or more symbols of a transmission; provide the representations of the one or more symbols through an interface to a buffer element to process; and reduce transmissions through the interface in response to providing the representations of the one or more symbols to the buffer element.

In example 2, in the apparatus of example 1, the representations of the one or more symbols comprise an indication of a subcarrier, a phase offset, and an amplitude.

In example 3, in the apparatus of example 1, the representations of the one or more symbols comprise IQ samples of a first duration of the symbol, wherein the first duration is to be extended by a sine wave generator.

In example 4, in the apparatus of example 1, the baseband circuitry is to reduce the transmissions through the interface during a plurality of non-continuous intervals of time.

In example 5, the apparatus of example 1, further comprises a radio frequency (RF) circuitry, wherein the RF circuitry is to generate a sine wave based on a representation of a first of the one or more symbols, wherein the sine wave is generated to be transmitted at a single frequency.

In example 6, in the apparatus of example 1, the baseband processing component is further to: determine a transmission period based on a number of one or more symbols to be transmitted and a number of times to repeat each of the one or more symbols; and reduce power consumption of the baseband processing component during at least a portion of the transmission period.

In example 7, the apparatus of example 1, the baseband processing component is further to generate representations for a single-tone transmission.

In example 8, in the apparatus of example 1, further comprises a memory buffer controller to provide the one or more symbols to radio frequency (RF) circuitry based on the representations provided to the buffer element.

In example 9, in the apparatus of example 8, the representation of the one or more symbols comprises I/Q samples, and wherein the RF circuitry further comprises an I/Q processing component and a Sine-wave generating component.

In example 10, in the apparatus of example 8, the representation of the one or more symbols comprises an indication of a phase offset, and wherein the RF circuitry further comprises a Sine-wave generating component coupled to a radio frequency circuitry.

In example 11, in the apparatus of example 1, a first representation of a first symbol comprises an indication of a first subcarrier and a first phase offset for a first frequency and a second subcarrier and a second phase offset for a second frequency.

In example 12, in the apparatus of example 1, the baseband circuitry is further to reduce power consumption in response to providing the representations of the symbols to the buffer element.

Example 13 is a system comprising baseband circuitry to generate a representation of one or more symbols of a transmission, wherein the representations comprise an indication of a subcarrier, a phase offset, and an amplitude; and radio frequency (RF) circuitry comprising a buffer element to, wherein the RF circuitry is to: receive the representations of the one or more symbols from the baseband circuitry and store the received representations of the one or more symbols in the buffer element; generate, based on the stored representations, a sine wave for each of the one or more symbols; and provide the generated sine waves to a power amplifier to transmit the one or more symbols.

In example 14, in the system of example 13, the baseband circuitry is further to determine the predetermined time period based on a number of symbols to be transmit and a number of times to repeat each symbol.

In example 15, in the system of example 13, the baseband circuitry is adapted to operate with reduced power during a predetermined time period that the RF circuitry is providing the generated sine waves to the power amplifier.

In example 16, in the system of example 13, the radio frequency circuitry is further to reduce power to an IQ processor while generating the sine wave and providing the sine wave to the power amplifier.

In example 17, the system of example 13 further comprises front-end module circuitry coupled to the radio frequency circuitry; and an antenna coupled to the front-end module circuitry.

In example 18, in the system of example 13, a first representation of a first symbol comprises an indication of a first subcarrier and a first phase offset for a first frequency and a second subcarrier and a second phase offset for a second frequency.

Example 19 is an apparatus comprising: means for generating a representations for each of a plurality of symbols of a transmission, wherein the means for generating the representations is to enter a reduced power state in response to providing the representations to a memory buffer; means for generating a sine wave at a phase offset and subcarrier indicated by the representations for each of the plurality of symbols.

In example 20, the apparatus of example 19 further comprises means for buffering the representations for each of the plurality of symbols.

Example 21 is a method comprising: generating representations of one or more symbols; providing the representations of the one or more symbols through an interface to a buffer element to process; and reducing communications through the interface to the buffer element during at least a portion of the processing of the representations of the one or more symbols.

In example 22, in the method of example 21, the representations of the one or more symbols comprise an indication of a subcarrier, a phase offset, and an amplitude.

In example 23, in the method of example 2, the representations of the one or more symbols comprises IQ samples of a first duration of the symbol, wherein the method further comprises extending the first duration by a sine wave generator.

In example 24, in the method of example 21, the portions of the processing of the representations comprise a plurality of non-continuous intervals of time.

In example 25, in the method of example 21, generating a sine wave based on a first representation of a first of the one or more symbols, wherein the sine wave is generated to be transmitted at a single frequency.

In example 26, the method of example 21 further comprises: determining a transmission period based on a number of symbols to be transmit and a number of times to repeat each symbol; and reducing power consumption during at least a portion of the transmission period.

In example 27, the method of example 21, further comprises providing the one or more symbols to radio frequency (RF) circuitry based on the representations provided to the buffer element.

In example 28, in the method of example 27, the representation of the one or more symbols comprises an indication of a phase offset, and wherein the RF circuitry further comprises a Sine-wave generating component coupled to a radio frequency circuitry.

In example 29, in the method of example 21, generating representations of one or more symbols comprises: generating a first representation of a first symbol comprising an indication of a first subcarrier and a first phase offset for a first frequency and a second subcarrier and a second phase offset for a second frequency.

In example 30, the method of example 21, further comprises reducing power consumption during at least the portion of the processing of the representations of the one or more symbols.

Example 31 is an apparatus comprising means to perform a method as claimed in any of examples 21 to 30.

Example 32 is a machine-readable storage including machine-instructions that, when executed, cause an apparatus to perform a method as claimed in any of examples 21 to 30.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

Instructions used to program logic to perform exemplary implementations of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one exemplary implementation, refers to the hardware, which is specifically configured to recognize and/or execute the code to be held on a non-transitory medium. Furthermore, in another exemplary implementation, use of a module refers to the non-transitory medium including the code, which is specifically adapted to be executed by the microcontroller to perform predetermined operations. And as can be inferred, in yet another exemplary implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one exemplary implementation, use of the term logic includes hardware, such as transistors, registers, or other hardware, such as programmable logic devices.

Use of the phrase 'configured to,' in one exemplary implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focuses on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one exemplary implementation, refers to some apparatus, logic, hardware, and/or element designed in such a way to enable use of the apparatus, logic, hardware, and/or element in a specified manner. Note as above that use of to, capable to, or operable to, in one exemplary implementation, refers to the latent state of an apparatus, logic, hardware, and/or element, where the apparatus, logic, hardware, and/or element is not operating but is designed in such a manner to enable use of an apparatus in a specified manner.

The exemplary implementations of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Reference throughout this specification to "one exemplary implementation" or "an exemplary implementation" means that a particular feature, structure, or characteristic described in connection with the exemplary implementation is included in at least one exemplary implementation of the present disclosure. Thus, the appearances of the phrases "in one exemplary implementation" or "in an exemplary implementation" on "in some exemplary implementations" in various places throughout this specification are not necessarily all referring to the same exemplary implementation. Furthermore, the particular features, structures, or characteristics may be combined in any suitable manner in one or more exemplary implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of exemplary implementation and other exemplarily language does not necessarily refer to the same exemplary implementation or the same example, but may refer to different and distinct exemplary implementations, as well as potentially the same exemplary implementation.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "selecting," "receiving," "determining," "generating," "measuring," "calculating," "setting," "identifying," "executing," "transmitting," "communicating," "accessing," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Also, the terms "first," "second," "third," "fourth," etc. as used herein are meant as labels to distinguish among different elements and may not necessarily have an ordinal meaning according to their numerical designation.

What is claimed is:

1. An apparatus of a mobile communication device, the apparatus comprising:
   a buffer element coupled to a transmitter of radio frequency (RF) circuitry; and
   a baseband processing circuitry operatively coupled to the buffer element, the baseband processing circuitry to:
      generate representations of one or more symbols of a transmission, wherein at least one of the representations comprises an indication of a subcarrier, a phase offset, and an amplitude;
      provide the representations of the one or more symbols through an interface to the buffer element;
      reduce transmissions through the interface to the buffer element during a plurality of non-continuous intervals of time in response to providing the representations of the one or more symbols to the buffer element; and
      adjust power consumption in response to a power mode of the baseband processing circuitry changing from a first power mode to a second power mode during at least a portion of a transmission period by the transmitter, wherein the second power mode is less than the first power mode.

2. The apparatus of claim 1, wherein at least one of the representations comprises an in-phase and quadrature (IQ) sample of a first duration of the one or more symbols and specifying a length of a sine wave, wherein the first duration is to be extended by the length by a sine wave generator.

3. The apparatus of claim 1, further comprising the RF circuitry, wherein the RF circuitry is to generate a sine wave based on a first representation of a first symbol of the one or more symbols, wherein the sine wave is generated to be transmitted at a single frequency.

4. An apparatus of a mobile communication device, the apparatus comprising:
   a buffer element; and
   a baseband processing circuitry operatively coupled to the buffer element, the baseband processing circuitry to:
      generate representations of one or more symbols of a transmission, wherein at least one of the representations comprises an indication of a subcarrier, a phase offset, and an amplitude;
      provide the representations of the one or more symbols through an interface to the buffer element;
      reduce transmissions through the interface to the buffer element in response to providing the representations of the one or more symbols to the buffer element;
      determine a transmission period based on a number of the one or more symbols to be transmitted and a number of times to repeat each of the one or more symbols; and
      adjust power consumption in response to a power mode of the baseband processing circuitry changing from a first power mode to a second power mode during at least a portion of the transmission period, wherein the second power mode is less than the first power mode.

5. The apparatus of claim 1, wherein the baseband processing circuitry is further to generate the representations for a single-tone transmission.

6. The apparatus of claim 1, further comprising a memory buffer controller to provide the one or more symbols to radio frequency (RF) circuitry based on the representations provided to the buffer element.

7. The apparatus of claim 6, wherein at least one of the representations comprises an in-phase and quadrature (IQ) samples that specifies a length and has a first duration, and wherein the RF circuitry further comprises an IQ processing circuitry and a Sine-wave generating circuitry, the Sine-wave generating circuitry to extend the first duration by the length.

8. The apparatus of claim 6, wherein the RF circuitry further comprises a Sine-wave generating circuitry coupled to the RF circuitry.

9. The apparatus of claim 1, wherein a first representation of a first symbol comprises an indication of a first subcarrier and a first phase offset for a first frequency and a second subcarrier and a second phase offset for a second frequency.

10. The apparatus of claim 1, wherein the baseband processing circuitry is further to adjust the power consumption in response to providing the representations of the symbols to the buffer element.

11. A system comprising:
   baseband circuitry to generate a representation of at least one symbol of a transmission, wherein the representation comprises an indication of a subcarrier, a phase offset, and an amplitude; and
   radio frequency (RF) circuitry comprising a buffer element and a transmitter, wherein the RF circuitry is to:
      receive the representation of the at least one symbol from the baseband circuitry and store the representation of the at least one symbol in the buffer element;
      generate, based on the representation, a sine wave for each of the one or more symbols;
      provide the sine waves to a power amplifier to transmit the one or more symbols;
      reduce transmissions through an interface to the buffer element during a plurality of non-continuous intervals of time; and
      adjust power consumption in response to a power mode of the baseband circuitry changing from a first power mode to a second power mode during at least a portion of a transmission period to transmit the at least one symbol in the buffer element, wherein the second power mode is less than the first power mode.

12. A system comprising:
   baseband circuitry to generate a representation of at least one symbol of a transmission, wherein the representation comprises an indication of a subcarrier, a phase offset, and an amplitude, wherein the baseband circuitry is further to determine a predetermined time period based on a number of symbols to be transmitted and a number of times to repeat each symbol; and radio frequency (RF) circuitry comprising a buffer element, wherein the RF circuitry is to:
receive the representation of the at least one symbol from the baseband circuitry and store the representation of the at least one symbol in the buffer element; and
generate, based on the representation, a sine wave for each symbol of the at least one symbol, wherein power consumption by the baseband circuitry is adjusted in response to a power mode of the baseband circuitry changing from a first power mode to a second power mode during at least a portion of a transmission period to transmit the at least one symbol in the buffer element, wherein the second power mode is less than the first power mode.

13. The system of claim 12, wherein the baseband circuitry is adapted to operate with reduced power during a predetermined time period that the RF circuitry is providing the sine wave for each symbol to a power amplifier.

14. The system of claim 11, wherein the RF circuitry is further to reduce power to an in-phase and quadrature (IQ) processor while generating the sine wave and providing the sine wave to a power amplifier.

15. The system of claim 11, further comprising:
front-end module circuitry coupled to the RF circuitry; and
an antenna coupled to the front-end module circuitry.

16. A system comprising:
baseband circuitry to generate a first representation of a first symbol comprising an indication of a first subcarrier, a first phase offset, and a first amplitude for a first frequency and a second representation of a second symbol comprising an indication of a second subcarrier, a second phase offset, and a second amplitude for a second frequency; and radio frequency (RF) circuitry comprising a buffer element, wherein the RF circuitry is to:
receive the first representation and the second representation from the baseband circuitry and store the first representation and the second representation in the buffer element;
generate, based on the first representation and the second representation, a first sine wave for the first symbol and a second sine wave for the second symbol; and
provide the first sine wave and the second sine wave to a power amplifier to transmit the first symbol and the second symbol, respectively, wherein power consumption by the baseband circuitry is adjusted in response to a power mode of the baseband circuitry changing from a first power mode to a second power mode during at least a portion of a transmission period to transmit the first symbol or the second symbol, wherein the second power mode is less than the first power mode.

* * * * *